United States Patent [19]

Herrnring et al.

[11] 3,959,006
[45] May 25, 1976

[54] SINGLE CRYSTAL ON THE BASIS OF GALLIUM GARNET

[75] Inventors: Jorg Herrnring, Hamburg; Wolfgang Tolksdorf, Tornesch; Christian Rusche, Hamburg; Dieter Mateika, Ellerbek; Gerhard Winkler, Hamburg, all of Germany

[73] Assignee: U.S. Philips Corporation, New York, N.Y.

[22] Filed: Sept. 16, 1975

[21] Appl. No.: 613,855

[52] U.S. Cl. ............ 106/42; 252/62.57; 423/263; 423/593
[51] Int. Cl.² ................................. C04b 35/50
[58] Field of Search ... 106/42; 252/62.57; 423/263, 423/593; 427/127; 428/539, 900

[56] References Cited

UNITED STATES PATENTS

| | | | |
|---|---|---|---|
| 3,723,599 | 3/1973 | Brandle et al. | 423/263 |
| 3,728,697 | 4/1973 | Heinz | 252/62.57 X |
| 3,755,023 | 8/1973 | Miller | 423/593 |
| 3,736,158 | 5/1973 | Cullen et al. | 106/42 |

OTHER PUBLICATIONS

Brandle et al. "Journal of Crystal Growth," No. 12, 1972, pp. 3–8.
Calhoun et al. "IBM Technical Disclosure Bulletin," Vol. 14, No. 7, Dec. 1971, p. 2220.
Giess et al. "IBM Technical Disclosure Bulletin," Vol. 14, No. 7, Dec. 1971, p. 2221.

*Primary Examiner* — Jack Cooper
*Attorney, Agent, or Firm* — Frank R. Trifari, Carl P. Steinhauser

[57] ABSTRACT

A single crystal on the basis of gadolinium/samarium/neodymium-gallium garnet as a substrate for epitaxial magnetic garnet layers for magneto-optical data storage or display devices and having a composition that corresponds to the formula $A_{3-x}^{3+} B_x^{2+} Ga_{5-x}^{3+} C_x^{4+} O_{12}$, wherein A = gadolinium, samarium, or neodymium, B = calcium, strontium, or magnesium, C = zirconium or tin and $0.2 \leq x \leq 0.8$.

2 Claims, No Drawing Figures

SINGLE CRYSTAL ON THE BASIS OF GALLIUM GARNET

The invention relates to a single crystal on the basis of rare earth gallium garnet.

Such single crystals are usually grown as long rods from a melt, for example, according to a method described in "Solid State Communications," 2(1964), pp. 229–231. Single crystal disks of the desired thickness are then cut from said rods.

Rare earth garnet single crystals $A_3^{3+}B_5^{3+}O_{12}$, in particular those of gadolinium-gallium garnet $Gd_3Ga_5O_{12}$ having a lattice constant $a_o$ of 12.382 Å., are preferably used as substrates of, for example 0.8 mm. thickness for magnetic storage materials in the so-called magnetic bubble technique (data storage technique while using mobile magnetic cylindrical domains) (compare IEEE Trans. Mag-7 (1971), p. 404). Thin magnetic garnet layers (storage material) of a few μm. thickness, for example 5 μm., are grown on said substrate crystals in known manner by a liquid phase or gaseous phase epitaxial process. Such garnet layers can grow with the required perfection on the above-described substrate only when substrate and epitaxial layer have substantially the same crystallographic lattice constant. In the data storage technique it is known that the magneto-optical (compare J. Appl. Phys. 40 (1969), pp. 1429–1435) quality-factor of the storage material can be increased substantially, when a sufficient quantity of bismuth is incorporated in the storage material, which produces an essential increase of the Faraday rotation. (German Offenlegungsschrift 2 349 348). Since the incorporation of bismuth increases the lattice constant, a substrate having an adjusted lattice constant $a_o$, preferably in the proximity of 12.48 Å. should be used in this case.

The starting material for this purpose has so far been neodymium-gallium garnet $Nd_3Ga_5O_{12}$ ($a_o$ = 12.506 Å.) or corresponding mixed crystals of $Nd_3Ga_5O_{12}$ ($d_o$ = 12.506 Å.) with samarium-gallium garnet $Sm_3Ga_5O_{12}$ ($a_o$ = 12.439 Å.) (IEEE Trans. Mag-7 (1971), pp. 404–409). The said crystals cannot be used as substrates for magneto-optical storage materials due to their optical absorption coefficient and the resulting reduction of the quality factor. In addition, they show the drawback inherent in the usual mixed crystals in the crystal manufacture, for example, according to the Czochralski growth method ("Journal of Crystal Growth" 9 (1971), p. 249), that the composition of the grown single crystal varies over its length, (that is the distribution coefficient deviates from one) so that the thin substrate disks cut therefrom have different compositions, and that a very low growth rate is to be chosen to prevent "supercooling."

It is the object of the invention to provide garnet substrate single crystals the lattice constant of which varies linearly with the composition so that a substrate having a suitable lattice constant is available for any layer composition of the magneto-optical storage material grown epitaxially, which crystals do not exhibit the above drawbacks.

According to the invention, this object is achieved in a single crystal of the kind mentioned in the preamble in that the garnet corresponds to the composition

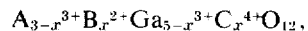

$$A_{3-x}^{3+}B_x^{2+}Ga_{5-x}^{3+}C_x^{4+}O_{12},$$

wherein
A = gadolinium, samarium or neodymium,
B = calcium, strontium or magnesium,
C = zirconium or tin and $0.2 \leq x \leq 0.8$.

The invention is based on the recognition of the fact that in gadolinium/samarium/neodynium-gallium garnets, a linear increase or decrease of the lattice constant $a_o$ can be achieved by the coupled replacement of the cations in the garnet lattice by smaller or larger 2- and 4-valent and 1- and 5-valent cations, respectively. It appears for example that the lattice constant $a_o$ increases linearly from 12.382 Å. for $Gd_3Ga_5O_{12}$ to 12.513 for $Gd_{2.2}Ca_{0.8}Ga_{4.2}Zr_{0.8}O_{12}$. The last-mentioned composition forms the limit mixed crystal. Higher Ca/Zr contents cannot be incorporated in the lattice.

For the application of said single crystals as substrates it is of importance that during the growth the composition and hence the lattice constant of the crystals be substantially the same between the beginning and the end of the growth. This can be achieved only when the distribution coefficient between crystal and melt is one or substantially one. Below $x=0.2$ in the above formula, the distribution coefficient is so small that the yield of useful substrate single crystal disks is too small for practical purposes.

By suitable choice of the concentration of the substituted components, however, it is possible to achieve a distribution coefficient of 1 or substantially 1. Good values can be obtained in particular with Ca/Zr-incorporation when in the formula $0.3 \leq x \leq 0.5$.

The invention will now be described in greater detail with reference to a few embodiments.

EXAMPLE 1

Growth of a $Gd_{2.4}Ca_{0.6}Ga_{4.4}Zr_{0.6}O_{12}$ single crystal.

The starting substances (159.9 g. of $Gd_2O_3$, 151.3 g. of $Ga_2O_3$, 22.0 g. of $CaCO_3$ and 26.6 g. of $ZrO_2$) are mixed, compressed to a cylinder and annealed in an $O_2$ atmosphere at 1400° C. The sintered body is then melted in an inductively heated iridium crucible at approximately 1800° C. in a closed crystal pulling apparatus. A gas mixture consisting of 99% of nitrogen and 1% of oxygen is led through the apparatus. As a seed crystal serves a cylindrical single crystal rod of gadolinium-gallium garnet. The pulling process is carried out in known manner according to the Czochralski method. The drawing rate is 2.5 mm./h., the rotation rate is 40 rpm. The crystals have a length of 100 mm. and a diameter of 22 mm. Their lattice constant $a_o$ is 12.477 Å.

EXAMPLE 2

Growth of an $Sm_{2.8}Sr_{0.2}Ga_{4.8}Zr_{0.2}O_{12}$ single crystal.

As starting substances were used 74.46 g. of $Sm_2O_3$, 4.12 g. of $SrCO_3$, 3.76 g. of $ZrO_2$ and 68.62 g. of $Ga_2O_3$. Preparation and performance of the growth occurred according to the same method as described in the first embodiment. The lattice constant $a_o$ of the single crystal thus grown is 12.460 Å.

In the following table the lattice constants $a_o$ of gallium garnets of the composition $$A_{3-x}^{3+}B_x^{2+}Ga_{5-x}^{3+}C_x^{4+}O_{12}$$

are shown as a function of the host lattice, the guest phase and its concentration.

TABLE

| $A^{3+}$ | $B^{2+}$ | $C^{4+}$ | x = 0.0 | x = 0.2 | x = 0.4 | x = 0.6 | x = 0.8 |
|---|---|---|---|---|---|---|---|
| Gd | Mg | Zr | 12.382 | 12.372 | 12.368 | 12.365 | 12.362 |
|    | Ca | Zr |        | 12.414 | 12.444 | 12.477 | 12.513 |
|    | Sr | Zr |        | 12.420 | 12.465 | –      | –      |
| Sm | Ca | Zr | 12.439 | 12.460 | 12.498 | 12.510 | 12.535 |
|    | Sr | Zr |        | 12.460 | 12.516 | –      | –      |
|    | Sr | Sn |        | 12.455 | 12.506 | –      | –      |
| Nd | Ca | Zr | 12.506 | 12.525 | 12.545 | 12.565 | –      |
|    | Sr | Zr |        | 12.533 | 12.569 | –      | –      |
|    | Ca | Sn |        | 12.520 | 12.535 | –      | –      |

The single crystals according to the invention are particularly suitable as substrates for epitaxial magnetic garnet layers for magneto-optical data storage or display devices.

For the manufacture of the magnetic garnet layers (storage layers), non-magnetic substrate single crystal disks according to the invention, for example, of $Gd_{2.4}Ca_{0.6}Ga_{4.4}Zr_{0.6}O_{12}$, are dipped in a liquid solution according to known methods (compare Appl. Phys. Lett. 19 (1971), pp. 486-488, and Journal of Crystal Growth 17 (1972), pp. 322-328) and garnet layers, for example of the composition $(GdBi)_3(FeAlGa)_5O_{12}$ are grown in a thickness of approximately 5 μm. according to the liquid phase epitaxy method.

For recording the information, the garnet layers are driven with a laser beam; as a result of the heating of the layer associated therewith, the polarization of the direction of magnetization is reversed locally under the simultaneous action of an external magnetic switching field (compare Appl. Phys. Lett. 20 (1972), pp. 451-453, and Phys. stat. sol (a) 17 (1973), pp. 175-179).

The technique used in reading the information state of a magneto-optical store (= making useful the magneto-optical Faraday effect) can of course also be used for optical display systems. For example, a magnetic bubble display of the projection type is known (compare IEEE. Trans. Mag-7 (1971), pp. 370 to 373) in which also for increasing the picture contrast a considerable substitution of, for example, a rare earth ion per formula unit by bismuth is necessary, which involves the already described problems and necessitates the use of a substrate with adapted lattice constant and small optical absorption in the visible spectrum range.

What is claimed is:

1. A single crystal on the basis of rare earth gallium garnet, characterized in that the garnet corresponds to the composition $A_{3-x}^{3+}B_x^{2+}Ga_{5-x}^{3+}C_x^{4+}O_{12}$, wherein
   A = gadolinium, samarium or neodymium,
   B = calcium, strontium or magnesium,
   C = zirconium or tin and $0.2 \leq x \leq 0.8$.

2. A single crystal is claimed in claim 1, characterized in that in the formula $0.3 \leq x \leq 0.5$.

* * * * *